United States Patent [19]

Yamanaka et al.

[11] Patent Number: 4,864,514

[45] Date of Patent: Sep. 5, 1989

[54] WIRE-BONDING METHOD AND APPARATUS

[75] Inventors: Kazuyuki Yamanaka, Yokohama; Mitsusada Shibasaka, Fujisawa, both of Japan

[73] Assignee: Kabushiki Kaisha Toshiba, Kawasaki, Japan

[21] Appl. No.: 91,118

[22] Filed: Aug. 31, 1987

[30] Foreign Application Priority Data

Sep. 2, 1986 [JP] Japan ................... 61-206553

[51] Int. Cl.$^4$ ............................. G06F 15/60
[52] U.S. Cl. ............................. 364/489; 364/488
[58] Field of Search ............... 364/488, 489, 490, 491

[56] References Cited

U.S. PATENT DOCUMENTS

| | | | |
|---|---|---|---|
| 3,598,978 | 8/1971 | Rempert | 364/490 |
| 4,253,111 | 2/1981 | Funk et al. | 364/491 |
| 4,390,955 | 6/1983 | Arimura | 364/490 |
| 4,435,835 | 3/1984 | Sakow et al. | 364/490 |
| 4,450,579 | 5/1984 | Nakashima et al. | 364/490 |
| 4,600,996 | 7/1986 | Kawauchi | 364/491 |
| 4,635,208 | 1/1987 | Coleby et al. | 364/490 |
| 4,718,019 | 1/1988 | Fillion et al. | 364/491 |

OTHER PUBLICATIONS

A. Harada, "Wire Bonder", Electronic Parts and Materials, 1983 pp. 140–145.
M. Okamura et al., "Wire Bonding Process", Practical Handbook on Semiconductor Manufacturing Equipment, 1985, Sec. 4, pp. 387–397.
Kulicke and Soffa Industries, Inc., Catalogue for Model 1471 high-productivity wedge bonding system.

Primary Examiner—Bruce Y. Arnold
Assistant Examiner—Terry S. Callaghan
Attorney, Agent, or Firm—Foley & Lardner, Schwartz, Jeffery, Schwaab, Mack, Blumenthal & Evans

[57] ABSTRACT

Wire-bonding of a semiconductor device designed in accordance with the CAD system is implemented on the basis of bonding data obtained by making use of the design data in the CAD system For the design data in the CAD system, coordinate data of the bonding pads and the lead frames and wiring information therebetween are used. Since ordinarily the coordinate system in the CAD system and the coordinate system in the wire-bonding apparatus are not equal to each other, coordinate transformation is applied to the bonding data obtained from the CAD system. The data thus transformed is delivered to the bonding unit. Since there is employed a scheme to utilize the design data in the CAD system, the necessity of inputting bonding data by an operator is eliminated, thus making it possible to carry out bonding work free from an error in a short time.

18 Claims, 5 Drawing Sheets

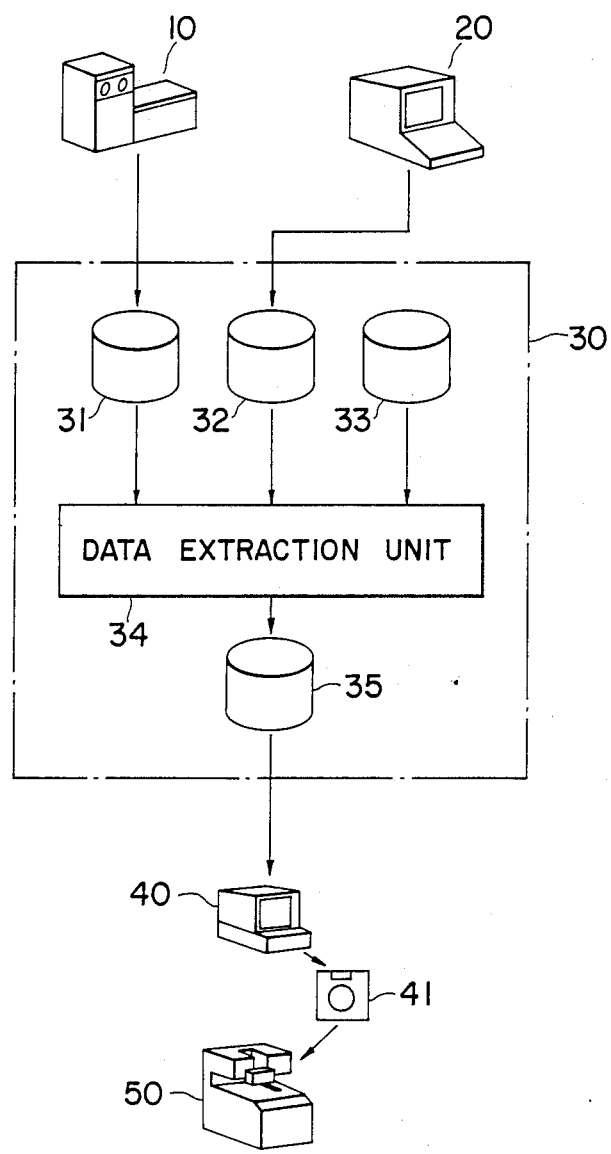
F I G. 2

FIG. 5
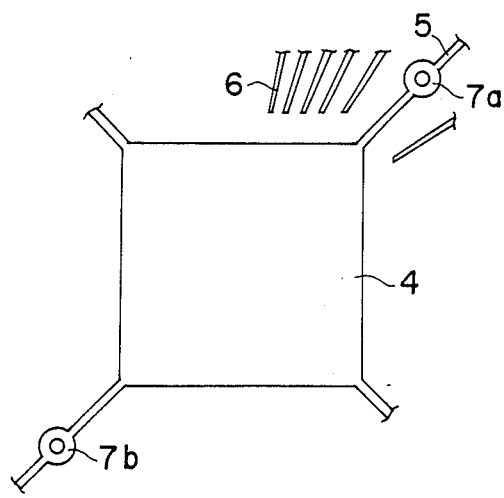
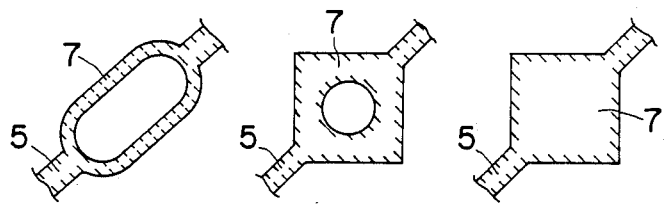
FIG. 6a  FIG. 6b  FIG. 6c
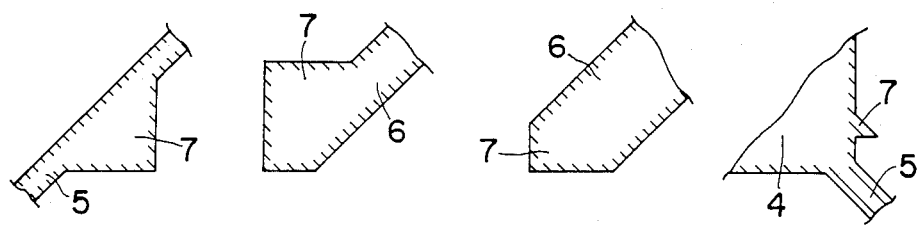
FIG. 6d  FIG. 6e  FIG. 6f  FIG. 6g

WIRE-BONDING METHOD AND APPARATUS

BACKGROUND OF THE INVENTION

The present invention relates to a method of fabricating a semiconductor device, and more particularly to a wire-bonding method for a semiconductor device.

In the method for manufacturing a semiconductor device, a wire-bonding process to electrically connect bonding pads on the semiconductor pellet and inner leads using bonding wires can be said to be an extremely important process. When carrying out such a wire-bonding, it is required to input bonding positional coordinates to the bonding apparatus. Typical methods of inputting bonding position coordinates which have been conducted in the art will be now described.

(1) Method of preparing a ROM

This method is featured by writing positional coordinate data into a PROM to deliver the data thus written to the bonding apparatus, and is implemented in accordance with the following procedure.

(a) An operator reads bonding positional coordinate data, i.e., positional coordinates of the bonding pads and positional coordinates of internal junctions of lead frames from the plan or design drawing of the semiconductor pellet and the lead frame.

(b) Coordinate values which have been read in a predetermined format are written using a PROM writer.

(c) The PROM having been written is set at the bonding apparatus to confirm the bonding positions on the bonding apparatus.

(d) If there is any dislocation in the bonding positions, the coordinate value of question is corrected to repeat the procedure from the process (b). When correction is made by parallelly moving the bonding positions in a whole scale, a digital switch provided on the bonding apparatus is operated to thereby set a quantity parallelly moved.

(2) Method of carrying out teaching work

According to this method, a teaching work is conducted to display an object of wire-bonding using a TV camera with it being locally enlarged, whereby an operator instructs positional coordinates to be subjected to bonding while observing a pictorial image on the monitor. This method is carried out in accordance with the following procedure.

(a) Movement adjustment of the XY stage of the bonding apparatus is made so that a point on an object which is to be the start point of the wire No. 1 is displayed at the central position of the monitor pictorial image. When the adjustment is completed, a predetermined input switch is operated to thereby store the coordinate values of the start point into the RAM provided in the bonding apparatus. This is so called "teaching work".

(b) Subsequently, similar teaching work is conducted in connection with the coordinate values of the point which is to be the terminating point of the wire No. 1, thereafter to store the coordinate values into the RAM.

(c) The above-mentioned procedures (a) and (b) are successively conducted in connection with the entire (d) Finally, the procedures (a) and (b) are conducted a second time in connection with the wires to be subjected to correction or alternation, thus to perform correction or alternation. When there is a need to parallelly move the bonding positions in a whole manner to make correction, it is sufficient to set a quantity parallelly moved in accordance with the same teaching work as that indicated by the procedure (a).

However, the drawbacks with the above-mentioned methods are as follows.

(1) The drawbacks with the method of preparing ROM.

An operator must manually carry out all of the work including the work for reading coordinate values from the plan, the work for writing the coordinate values into PROM, and the work for correcting the coordinate values. These works are very troublesome, with the result that not only much labor and time are spent, but also an error is likely to occur.

(2) The drawbacks with the method of carrying out the teaching work.

This method allows the load of the work to be somewhat reduced as compared to the method described in the above-mentioned paragraph (1) in that it is not required for an operator to directly handle numerical values. However, the teaching work can be still said to be the work in which much labor and time are spent and an error is likely to occur. For example, since the pictorial image on the monitor is obtained by locally enlarging an object of wire-bonding using a TV camera, the visual field is narrow and it is very difficult for an operator to recognize which portion of the entirety of the object of wire-bonding is occupied by the pictorial image presently displayed. For this reason, there likely occurs an error such that teaching is erroneously conducted in connection with the adjacent bonding pads or adjacent leads.

As just described above, the conventional wire-bonding methods have the drawbacks that it takes much labor and time in the work for inputting bonding positional coordinates, resulting in high possibility that the work is erroneously conducted.

SUMMARY OF THE INVENTION

With the above in view, an object of the present invention is to provide a wire-bonding method capable of conducting a work free from errors in a short time and with ease.

The first feature of the present invention resides in a wire-bonding method for a semiconductor device designed in accordance with the CAD (Computer Aided Design) system wherein design data in the CAD system is delivered to a bonding apparatus, thus allowing the bonding apparatus to be operative on the basis of the design data.

The second feature of the present invention resides in a wire-bonding method for a semiconductor device designed in accordance with the CAD system, the method comprising the steps of extracting coordinate values on a semiconductor pellet from the CAD system, extracting coordinate values on leads from the CAD system, extracting wiring information for bonding from the CAD system, preparing bonding data having positional coordinates for bonding on the basis of the coordinate values on the pellet, the coordinate values on the leads and the wiring information which have been extracted, inputting the bonding data thus prepared to a bonding unit, and driving the bonding unit on the basis of the bonding data thus input.

The third feature of the present invention resides in a wire-bonding method for a semiconductor device designed in accordance with the CAD system, the method comprising the steps of extracting coordinate values on a semiconductor pellet from the CAD system with they being represented in a first coordinate system used in the CAD system, extracting coordinate values on the leads from the CAD system with they being represented in the first coordinate system, extracting wiring information for bonding from the CAD system, preparing bonding data having positional coordinates for bonding from the coordinate values on the pellet, the coordinate values on the lead and the wiring information which have been extracted, inputting the bonding data thus prepared to a bonding unit, transforming the input bonding data to corresponding data in a second coordinate system used in the bonding unit, driving the bonding unit on the basis of the bonding data having been transformed.

The fourth feature of the present invention resides in an apparatus for implementing wire-bonding to a semiconductor device designed by a chip CAD for designing a pattern on a semiconductor pellet and a lead CAD for designing a pattern on a lead frame on the basis of a predetermined wiring information, the wire-bonding apparatus comprising a first memory unit for storing design data in the chip CAD, a second memory unit for storing design data in the lead CAD, a third memory unit for storing a wiring information, a data extraction unit for preparing bonding data having bonding positional information on the basis of the data from the first, second and the third memory units, a coordinate transformation unit for transforming a coordinate system of the bonding data prepared in the data extraction unit, and a unit for carrying out wire-bonding on the basis of the bonding data having been transformed by the coordinate transformation unit.

This invention permits the wire-bonding apparatus to be operative on the basis of the design data in the CAD system, thus making it unnecessary for an operator to manually input bonding data which has been required in the conventional methods. Accordingly, this makes it possible to carry out bonding work free from an error in a short time and with ease.

BRIEF DESCRIPTION OF THE DRAWINGS

FIG. 2 is a block diagram illustrating an embodiment of an apparatus used in the wire-bonding method according to the present invention;

FIG. 5 is a schematic view illustrating the configuration of a lead frame used when the method according to the present invention is carried out;

FIG. 6 shows example of the modification of a reference pattern used in the lead frame shown in FIG. 5.

DESCRIPTION OF THE PREFERRED EMBODIMENT

Figure 1:
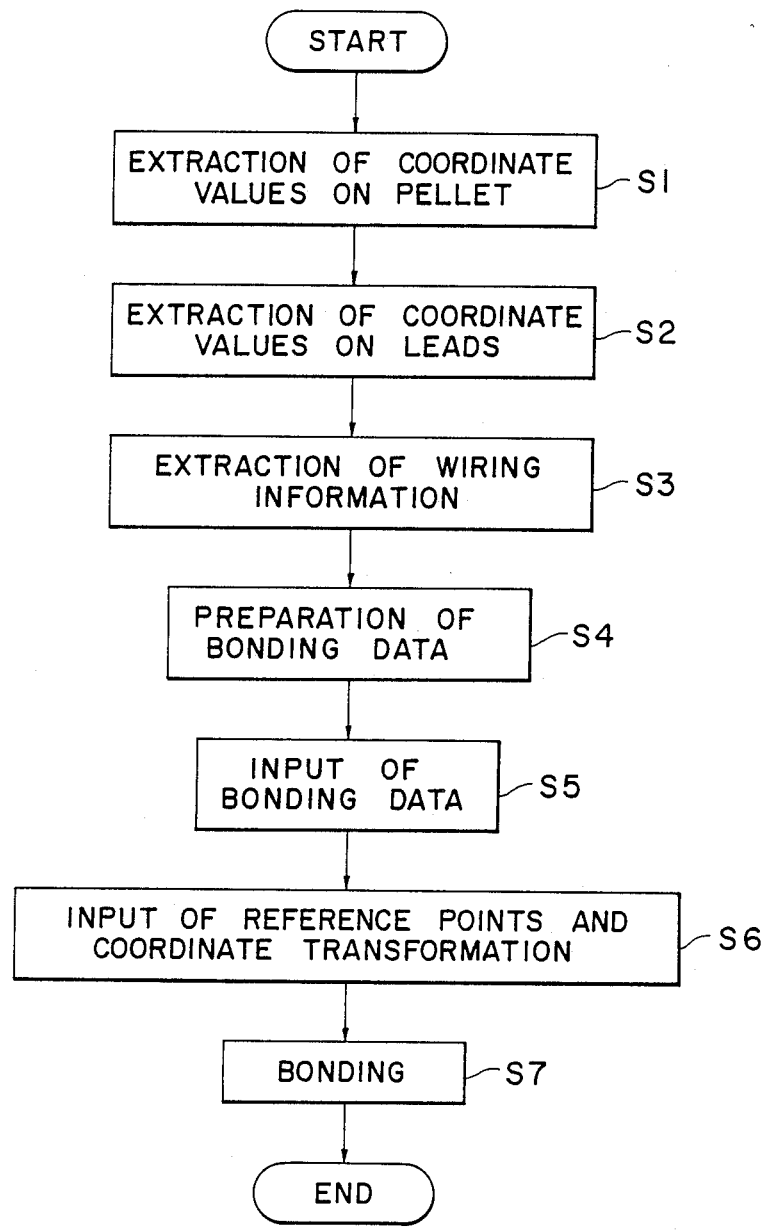
FIG. 1 is a flow chart showing wire-bonding method according to the present invention.

The present invention will be described in detail in connection with an embodiment shown. FIG. 1 is a flow chart showing a wire-bonding method according to the present invention. As indicated by this flow chart, the method according to the present invention comprises seven steps labeled S1 to S7. An example of the hardware configuration for carrying out this wire-bonding method is shown in FIG. 2.

The outline of all the procedures will be first explained. The elementary concept of the present invention resides in the employment of a scheme to prepare bonding data necessary for wire-bonding on the basis of the data of CAD system used for designing the semiconductor pellet and the lead frame to deliver the data thus prepared to the bonding unit to thereby carry out bonding. In the example of the configuration of the apparatus shown in FIG. 2, the CAD system comprises a chip CAD 10, a lead CAD 20 and a generalized computer 30. The chip information prepared by the chip CAD 10 is delivered to a memory 31 and the lead information prepared by the lead CAD 20 is delivered to a memory 32. In addition, wiring information is input to a memory 33. A data extraction unit 34 extracts necessary data from these memories to prepare bonding data to thereby deliver it to a memory 35. The procedures just described above correspond to the steps S1 to S4 in FIG. 1. More particularly, at step S1, data related to coordinate values on the pellet is extracted from the chip information in the memory 31. At step S2, data related to coordinate values on the leads is extracted from the lead information in the memory 32. At step S3, the wiring information in the memory 33, i.e., the correspondence relationship between the bonding pads on the pellet and inner lead portions on the leads which are subjected to bonding is extracted. In the ordinary CAD system, data and wiring information for indication of the bonding position are provided independent of the data indicative of pictorial image for indication of layout. Accordingly, it is sufficient to carry out the work for extracting data independently provided at the steps S1 to S3. Then, at step S4, coordinate values, e.g., start point or terminating point etc. necessary for bonding, i.e., bonding data are prepared on the basis of the data extracted at these steps S1 to S3.

Subsequently, input of the bonding data is carried out at step S5. In this embodiment, this inputting is not directly implemented to the bonding unit, but the same is conducted through a minicomputer 40. This is because operations for inputting reference points and for performing coordinate transformation which will be described later are conducted at step S6. The bonding data having been transformed by the minicomputer 40 is delivered to the bonding unit 50 by using a floppy or flexible disk 41 as a medium. At step S7, the actual bonding will be conducted. The respective steps referred to above will be described in detail.

(1) Extraction of coordinate values on the pellet (step S1)

Figure 3:
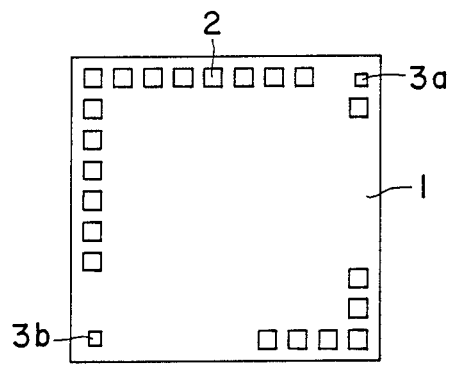
FIG. 3 is a schematic view illustrating the configuration of a pellet used when the method according to the present invention is carried out.
Figure 4A:
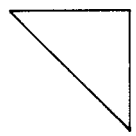
FIG. 4 shows examples of the modification of a reference pattern used in the pellet shown in FIG. 3.
Figure 4B:
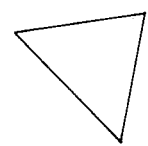
Figure 4C:
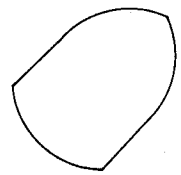
Figure 4D:
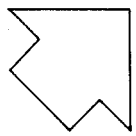
Figure 4E:
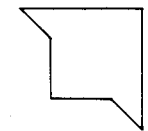
Figure 4F:
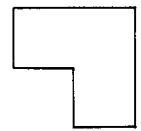
Figure 7:
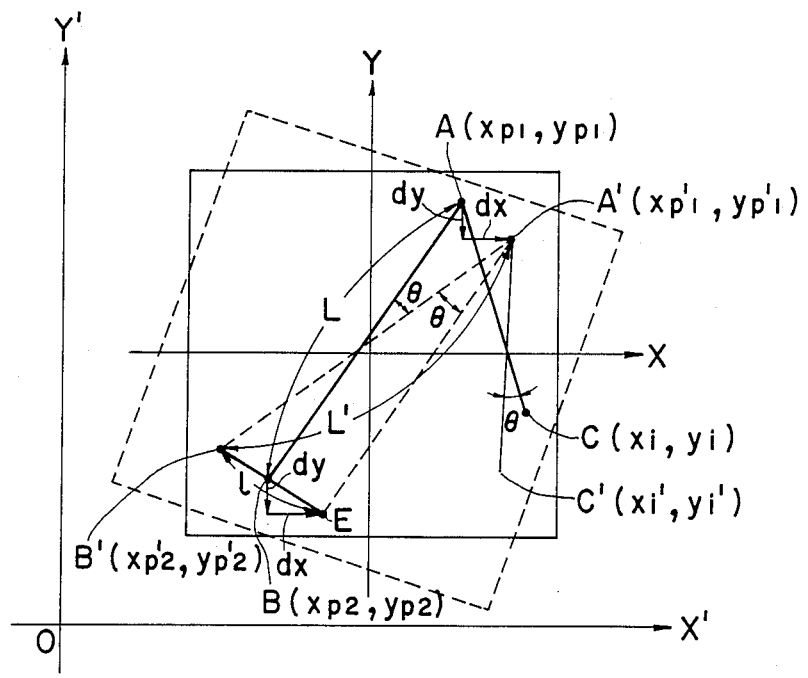
FIG. 7 is a diagrammatical view showing an example of a coordinate transformation method employed in the present invention.

As shown in FIG. 3, the semiconductor pellet 1 is provided with a large number of bonding pads 2. These bonding pads 2 serve as bonding objects on the side of the pellet. The semiconductor pellet 1 is further provided with reference patterns 3a and 3b. These reference patterns serve as patterns which define reference points in the case of performing transformation of the coordinate system at step S6 described later. In this example, the reference patterns 3a and 3b, are square, which are slightly smaller than the bonding pads 2. In addition, the reference pattern may have specified shapes as shown in FIGS. 4(a) to 4(f). In short, for the reference patterns 3a and 3b, they may have any shapes as long as they have shapes which can be easily distinguished from the bonding pads 2. It is sufficient to provide at least two such reference patterns.

In the case of designing the pellet 1 on the basis of the CAD system, coordinate values of respective bonding pads 2 and reference patterns 3a, and 3b are set at the chip CAD 10 and they are preserved in the memory 31. Thus, these coordinate values can be easily extracted from the memory 31. It is to be noted that the coordinate values of the bonding pads 2 or the reference patterns 3a and 3b are defined as coordinate values at the central positions thereof. It is needless to say that such coordinate values may be defined as those, e.g., at right upper corners of the bonding pads 2 or the reference patterns 3a and 3b without defining them as coordinate values at the central positions thereof. The accuracy of the coordinate values is determined in consideration of resolution of the XY stage of the bonding unit 50 used at step S7.

In a manner stated above, the coordinate values ($x_{p1}$, $y_{p1}$) and ($x_{p2}$, $y_{p2}$) of the reference patterns 3a, and 3b; and coordinate values ($x_i$, $y_i$) (i denotes a number indicating a specified bonding pad) of the respective bonding pads 2 on the side of the pellet are extracted by the data extraction unit 34. These coordinate values are memorized in the form of text file.

(2) Extraction of coordinate values on leads (step S2)

As shown in FIG. 5, each lead is provided with a bed 4, tub leads 5 and a large number of inner leads 6. In this embodiment, reference patterns 7a and 7b are further provided on the tub leads 5. Similarly to the reference patterns 3a and 3b, these reference patterns 7a and 7b, serve as patterns which define reference points in the case of performing transformation of the coordinate system at the step S6. These reference patterns 7a and 7b; are shaped as shown in FIG. 5, but may have various shapes as shown in FIGS. 6(a) to 6(d). Further, they may be provided on the inner leads 6 as shown in FIGS. 6(e) and 6(f), or on the bed 4 as shown in FIG. 6(g). In short, as long as a method capable of easily discriminating as a reference pattern is employed, such a reference pattern may be provided at any position and in an arbitrary shape. It is sufficient to provide at least two such reference patterns.

When such a lead is designed on the basis of the CAD system, all of coordinate values are set at the lead CAD 20 and are preserved in the memory 32. Thus, coordinate values ($x_{L1}$, $y_{L1}$) and ($x_{L2}$, $y_{L2}$) of the reference patterns 7a and 7b and coordinate values ($x_j$, $y_j$) (j denotes a number indicating a specified point) of bonding points (which are ordinarily defined as points on the central line of the lead spaced from the tip by 0.4 mm) are extracted by the data extraction unit 34. These coordinate values are memorized in the form of the text file.

(3) Extraction of wiring information (step S3)

In accordance with the design based on the CAD system, the correspondence relationship between a plurality of bonding pads 2 and a plurality of inner leads 6 are also memorized in an arbitrary form. Such a correspondence relationship is required as wiring information in carrying out bonding. This correspondence relationship is not limited to the case that all of the bonding pads 2 and the inner leads 6 are used for wiring, and is not necessarily one-to-one correspondence. For example, a correspondence relationship described below may be extracted as the wiring information from the CAD system:

| | |
|---|---|
| lead No. 1: | pad No. 1 |
| lead No. 2: | pad No. 2 |
| . | . |
| . | . |
| lead No. 8: | pad No. 8 |
| lead No. 9: | pad No. 11 |
| . | . |
| . | . |
| lead No. 21: | pad No. 23 |
| lead No. 21: | pad No. 24 |
| . | . |

For the wiring information, the number of all wires necessary for bonding or the like may be further included. Such a wiring information is extracted by the data extraction unit 34 and is memorized in the form of the text file.

(4), Preparation of bonding data (step S4)

The data extraction unit 34 then combines and arranges respective data having been extracted at the steps S1 to S3 to thereby prepare bonding data which can be directly used for wire-bonding. In this preparation step, a processing, e.g., alternation of the bonding sequence corresponding to various special wire-bonding methods, change of bonding point or the like is also conducted. For example, in case where wiring is implemented to one lead using two wires from two pads, when bonding is carried out with two wires overlapping with each other at the same point on the side of the lead, an inconvenience would occur. To eliminate this, at the process for preparing bonding data, there is conducted a process such that two bonding points spaced from each other are provided on the side of the lead.

The bonding data thus obtained consists of a text file in which coordinate values indicating start and terminating points for each wire are arranged. For example, such bonding data is as follows:

| |
|---|
| wire No. 1, start point ($x_a$,$y_a$), terminating point ($x_b$,$y_b$) |
| wire No. 2, start point ($x_c$,$y_c$), terminating point ($x_d$,$y_d$) |
| . |
| . |

To the bonding data, other necessary number of wires and coordinate values ($x_{p1}$, $y_{p1}$), ($x_{p2}$, $y_{p2}$), ($x_{L1}$, $y_{L1}$) and ($x_{L2}$, $y_{L2}$) are added. It is preferable that the name of the product peculiar to the semiconductor device, the name of the array type, the name of the package and the like are further added thereto.

(5) Input of the bonding data (step S5)

As previously described, the processes of the steps S1 to S4 are executed in the generalized computer 30 used in the CAD system. For this reason, a work for introducing the bonding data prepared in the generalized computer 30 into the bonding unit is required. In this embodiment, as shown in FIG. 2, the bonding data in the memory 35 is transferred to the minicomputer 40. This transfer work may be conducted through an external storage medium such as a floppy disk, or may be conducted using any communication means.

(6) Input of reference points and the coordinate transformation (step S6)

The bonding data input at the step S5 is the coordinate value data based on the coordinate system in the CAD system (which will be called "first coordinate system" hereinafter). However, the coordinate system actually defined in the bonding apparatus is the coordinate system in the XY stage provided in the bonding unit (which will be called "second coordinate system" hereinafter). When both the coordinate systems are completely identified to each other, this step is not required. However, since the bonding apparatus is ordinarily constructed in an independent manner without consideration of the coordinate system of the CAD system, positional discrepancy or shift of the origin and rotational discrepancy or shift of the coordinate axis occur between both the coordinate systems. Further, since the object of bonding ordinarily is heated to conduct bonding in the bonding unit, there is the possibility that variable magnification discrepancy or shift occurs with respect to the CAD data which is a value designed at normal temperature due to the thermal expansion at the time of bonding. This thermal expansion generally exhibits complicated behavior according to various environmental conditions and it is therefore difficult to predict it in advance. Accordingly, it is necessary to correct such a discrepancy on the bonding apparatus with the actual material subject to bonding being as the object. Thus, a work for transforming the coordinate values defined in the first coordinate system to those in the second coordinate system is required in the minicomputer 40.

To realize this, coordinate values $(x_{p1}', y_{p1}')$, $(x_{p2}', y_{p2}')$, $(x_{L1}', y_{L1}')$ and $(x_{L2}', y_{L2}')$ of the reference patterns 3a, 3b, 7a and 7b in the second coordinate system are calculated. They can be calculated in accordance with the conventional method of conducting teaching work. Namely, it is sufficient to instruct positions of the above four reference patterns on the monitor image. Since this can be accomplished by instructing only four portions, the load of the work is extremely reduced.

The coordinate transformation is performed, e.g., in accordance with the following procedure. It is now assumed that coordinate values in the first coordinate system at the central points of the reference patterns 3a and 3b are represented with $A(x_{p1}, y_{p1})$ and $B(x_{p2}, y_{p2})$ and coordinate values in the second coordinate system thereof are represented with $A'(x_{p1}', y_{p1}')$ and $B'(x_{p2}', y_{p2}')$, respectively. In this instance, coordinate values $C(x_i, y_i)$ in the first coordinate system of an arbitrary point is transformed to coordinate values $C'(x_i', y_i')$ in the second coordinate system in a manner stated below. Assuming that positional shifts in X and Y directions between $A(x_{p1}, y_{p1})$ and $A'(x_{p1}', y_{p1}')$ are designated at $d_x$ and $d_y$, respectively, they are expressed below:

$$d_x = x_{p1}' - x_{p1} \text{ and} \qquad (1)$$
$$d_y = y_{p1}' - y_{p1}.$$

Assuming that the positionally shifted point When the point B is assumed to be positionally shifted by $d_x$ and $d_y$ in the same manner as at the point A is the point E, the length of the line segment AB is L, the length of the line segment A'B' is L', the length of the line segment B'E is l, an angle which the line segments AB and A'B' form is $\theta$, the following equation holds:

$$\cos\theta = (L^2 + L'^2 - l^2)/2LL', \text{ and} \qquad (2)$$
$$\sin\theta = (1 - \cos^2\theta)^{\frac{1}{2}}$$

where:
$L = \{(x_{p1} - x_{p2})^2 + (y_{p1} - y_{p2})^2\}^{\frac{1}{2}}$,
$L' = \{(x_{p1}' - x_{p2}')^2 + (y_{p1}' - y_{p2}')^2\}^{\frac{1}{2}}$, and
$l = \{(x_{p2}' - x_{p2} - d_x)^2 + (y_{p2}' - y_{p2} - d_y)^2\}^{\frac{1}{2}}$.

using the above equations (1) and (2), coordinate values $(x_i', y_i')$ after subjected to transformation are calculated from the following equation:

$$\begin{pmatrix} x_i' \\ y_i' \end{pmatrix} = \begin{pmatrix} x_{p1}' \\ y_{p1}' \end{pmatrix} - \frac{L'}{L} \begin{pmatrix} \cos\theta & -\sin\theta \\ \sin\theta & \cos\theta \end{pmatrix} \qquad (3)$$

$$\left\{ \begin{pmatrix} x_{p1}' \\ y_{p1}' \end{pmatrix} - \begin{pmatrix} x_i \\ y_i \end{pmatrix} - \begin{pmatrix} d_x \\ d_y \end{pmatrix} \right\}.$$

Accordingly, all the coordinate values of the bonding data in the first coordinate system which have been input at the step S5 can be transformed to those in the second coordinate system. The transformations on the sides of the pellet and the leads are independently performed. It is to be noted that since the second coordinate system is peculiar to the bonding apparatus, another bonding unit will have a different second coordinate system. Accordingly, when floppy disks for personal use etc. are provided for respective bonding apparatus thus to store bonding data after subjected to transformation therein, this is convenient when used for a second time. Namely, by only inputting data from the floppy disk, it is possible to conduct wire-bonding.

(7) Bonding (step S7)

When bonding data which have been transformed to those in coordinate systems peculiar to the receptive bonding units are thus provided, it is possible to carry out wire-bonding on the basis of these data thus provided. Inputting the transformed data to the bonding unit 50 may be conducted through an external storage medium such as a floppy disk, or may be conducted using any communication means. In this embodiment, the bonding data after subjected to transformation, which have been output from the minicomputer 40, are written into the floppy disk 41. By using this floppy disk 41, inputting to the bonding unit 50 is carried out. The XY stage in the bonding unit 50 will move the bonding object on the basis of the given coordinate values.

What is claimed is:

1. A wire-bonding method for a semiconductor device designed in accordance with a CAD system, said method comprising:
   a step of extracting coordinate values of a semiconductor pellet from said Computer Aided Design system;
   a step of extracting coordinate values of leads from said Computer Aided Design system;
   a step of extracting wiring information for bonding from said Computer Aided Design system;
   a step of preparing bonding data having positional coordinates for bonding on the basis of (1) said coordinate values of said pellet, (2) said coordinate values of said leads, and (3) said wiring information;

a step of inputting said bonding data to a bonding unit; and a step of driving said bonding unit on the basis of said bonding data.

2. A wire-bonding method as set forth in claim 1, wherein said coordinate values of said pellet include coordinate values of bonding pads on said semiconductor pellet.

3. A wire-bonding method as set forth in claim 2, wherein said coordinate values of said bonding pads are the coordinate values at central positions of said bonding pads.

4. A wire-bonding method as set forth in claim 1, wherein said coordinate values of said leads include coordinate values of bonding points on inner leads.

5. A wire-bonding method as set forth in claim 1, wherein said wiring information indicate a corresponding relationship between bonding pads on said semiconductor pellet and inner leads.

6. A wire-bonding method as set forth in claim 1, wherein the accuracy of the extracted coordinate values is determined in consideration of the resolution of an XY stage of said bonding unit.

7. A wire-bonding method as set forth in claim 1, wherein said bonding data includes start coordinates and terminating coordinates of respective bonding wires.

8. A wire-bonding method as set forth in claim 1, wherein said bonding data includes the number of bonding wires.

9. A wire-bonding method as set forth in claim 1, wherein said bonding data is input to said bonding unit through a floppy or flexible disk.

10. A wire-bonding method as set forth in claim 1, wherein said bonding data is subjected to format conversion by using a minicomputer and is then input to said bonding unit.

11. A wire-bonding method for a semiconductor device designed in accordance with a Computer Aided Design system, said method comprising:

a step of extracting coordinate values of a semiconductor pellet from said Computer Aided Design system being represented in a first coordinate system used in said Computer Aided Design system;

a step of extracting coordinate values of leads from said Computer Aided Design system which are represented in said first coordinate system;

a step of extracting wiring information for bonding from said Computer Aided Design system;

a step of preparing bonding data having positional coordinates for bonding on the basis of (1) said coordinate values of said pellet, (2) said coordinate values of said leads and (3) said wiring information;

a step of inputting said bonding data to a bonding unit;

a step of transforming said input bonding data to corresponding data in a second coordinate system used in said bonding unit; and a step of driving said bonding unit on the basis of said bonding data.

12. A wire-bonding method as set forth in claim 11, wherein said coordinate values of said pellet and said coordinate values of said leads respectively include coordinate values of reference points for said pellet and coordinate values of reference points for said leads, whereby when transformation to said second coordinate system is carried out, coordinate values of said respective reference points in said second coordinate system are calculated to compare coordinate values in said first and second coordinate systems in respect to the same reference point.

13. A wire-bonding method as set forth in claim 12, wherein coordinate values in said first and second coordinate systems are compared to obtained values of positional shift, rotational shift and variable shift between said first and second coordinate systems to perform transformation with reference to these obtained values.

14. A wire-bonding method as set forth in claim 12, wherein at least two reference points are provided for said pellet and said leads.

15. An apparatus for implementing wire-bonding to a semiconductor device designed using a Computer Aided Design System which is used for designing a pattern on a semiconductor pellet and a Computer Aided Design System which is used for designing a pattern on a lead frame on the basis of wiring information input thereto, said semiconductor pellet having bonding pads and inner leads thereon, said wire-bonding apparatus comprising:

a first memory unit for storing design data with respect to the pattern on a semiconductor pellet in said Computer Aided Design System used for designing a pattern on said semiconductor pellet;

a second memory unit for storing design data with respect to the pattern on a lead frame in said Computer Aided Design System used for designing a pattern on said lead frame;

a third memory unit for storing said wiring information;

a data extraction unit for preparing bonding data having positional information on the basis of said data from said first, second and third memory units;

a coordinate transformation unit for transforming a coordinate system of said bonding data prepared in said data extraction unit; and a unit for carrying out wire-bonding on the basis of said bonding data having been transformed by said coordinate transformation unit.

16. A wire-bonding apparatus as set forth in claim 15, wherein said first memory unit stores therein coordinate values of bonding points on said bonding pads.

17. A wire-bonding apparatus as set forth in claim 15, wherein said second memory unit stores therein coordinate values of bonding points on said inner leads.

18. A wire-bonding apparatus as set forth in claim 15, wherein said third memory unit stores therein the correspondence relationship between said bonding pads and said inner leads.

* * * * *